United States Patent
Ha

(10) Patent No.: US 6,704,241 B1
(45) Date of Patent: Mar. 9, 2004

(54) MEMORY ARCHITECTURE WITH VERTICAL AND HORIZONTAL ROW DECODING

(75) Inventor: Chang Wan Ha, Pleasanton, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/238,048

(22) Filed: Sep. 6, 2002

(51) Int. Cl.[7] .............................. G11C 8/00; G11C 16/04
(52) U.S. Cl. ............................ 365/230.06; 365/185.11; 365/185.13
(58) Field of Search ....................... 365/185.11, 185.13, 365/230.03, 230.06

(56) References Cited

U.S. PATENT DOCUMENTS

| | | | |
|---|---|---|---|
| 5,410,508 A | | 4/1995 | McLaury |
| 5,896,340 A | * | 4/1999 | Wong et al. ............ 365/230.06 |
| 5,940,343 A | * | 8/1999 | Cha et al. ............... 365/230.06 |
| 5,977,799 A | | 11/1999 | Kai et al. |
| 5,978,277 A | | 11/1999 | Hsu et al. |
| 5,986,966 A | * | 11/1999 | Nagata ................... 365/230.06 |
| 6,026,047 A | * | 2/2000 | Ryu et al. ............... 365/230.06 |
| 6,088,287 A | | 7/2000 | Bill et al. |
| 6,198,685 B1 | * | 3/2001 | Sudo et al. ............. 365/230.06 |
| 6,587,375 B2 | * | 7/2003 | Chung et al. ........... 365/185.13 |

OTHER PUBLICATIONS

Atsumi et al. "A Channel–Erasing 1.8V–Only 32Mb NOR Flash EEPROM with a Bit–Line Direct–Sensing Scheme," IEEE Journal of Solid–State Circuits 35:1648–1654 (2000).
Hirose et al, "A 20nS 4Mb CMOS SRAM with Hierarchical Word Decoding Architecture," IEEE International Solid–State Circuits Conference, Digest of Technical Papers, pp. 132–133 (1990).

* cited by examiner

Primary Examiner—Son Mai
(74) Attorney, Agent, or Firm—Townsend and Townsend and Crew, LLP

(57) ABSTRACT

In accordance with an embodiment of the present invention, a semiconductor memory includes a memory array having a plurality of rows and columns of sectors, a horizontal global row decoder, a vertical global row decoder, and a plurality of horizontal local row decoders. Each of the sectors has a plurality of rows and columns of memory cells. The horizontal global row decoder is configured to select one of the rows of sectors in response to a first set of row address signals. The vertical global row decoder is configured to select one or two adjacent columns of the columns of sectors in response to a second set of row address signals. The plurality of horizontal local row decoders are coupled to the vertical global row decoder and the horizontal global row decoder to select one or two adjacent sectors located at the intersection of the selected row of sectors and the selected one or two adjacent columns of sectors.

40 Claims, 3 Drawing Sheets

MEMORY ARCHITECTURE WITH VERTICAL AND HORIZONTAL ROW DECODING

BACKGROUND OF THE INVENTION

In the stand-alone and embedded semiconductor memory areas, as the memory density increases, the silicon area consumed by the memory needs to be reduced in order to remain cost-effective. Memory cell size is continuously being reduced to achieve such silicon area reduction. If the continued efforts in reducing the cell size is not accompanied with similar efforts in reducing the size of those periphery circuits which interface with the memory array, the silicon area consumed by the periphery circuit becomes the bottleneck in achieving smaller silicon area.

Row decoder circuit is one of the circuit blocks which interfaces with the memory array. Conventionally, the wordline (row) path of a memory includes address buffers driving row predecoding circuits which in turn drive the row decoder. The address buffer and row predecoding circuits are generally located in the periphery area of a memory and do not physically interface with the memory array. However, the row decoder usually extends along one side or through the center of the memory array. With a reduction in the cell size, the memory cell pitch within which the row decoder needs to be formed is equally reduced. Thus, to achieve an effective overall area reduction, the row decoder needs to be reduced in size.

Conventional row decoders include multi-decoding stages. In, for example, a three-stage row decoding scheme, a first decoding stage receives a first group of predecoded row address signals and in response selects a group of the decode logic in the second decoding stage. The second decoding stage, in addition to the signal(s) from the first decoding stage, receives a second set of predecoded row address signals and in response selects one of a group of wordline drivers which form the third decoding stage. This third decoding stage, in addition to the signal(s) from the second decoding stage, may receive a third set of predecoded row address signals and in response selects a wordline in one or more memory arrays.

Many row decoding schemes for minimizing the size of the row decoder, for example by reducing the number of transistors in one or more of the three decoding stages of the row decoder, have been proposed and used. Although such reduction in the number of transistors results in a smaller row decoder, no technique has been proposed which yields a substantial reduction in the silicon are consumed by the row decoder.

Thus, there is a need for a circuit technique and array configuration which yield a significant reduction in the silicon area consumed by the row decoder.

BRIEF SUMMARY OF THE INVENTION

In accordance with an embodiment of the present invention, a semiconductor memory includes a memory array having a plurality of rows and columns of sectors, a horizontal global row decoder, a vertical global row decoder, and a plurality of horizontal local row decoders. Each of the sectors has a plurality of rows and columns of memory cells. The horizontal global row decoder is configured to select one of the rows of sectors in response to a first set of row address signals. The vertical global row decoder is configured to select one or two adjacent columns of the columns of sectors in response to a second set of row address signals. The plurality of horizontal local row decoders are coupled to the vertical global row decoder and the horizontal global row decoder to select one or two adjacent sectors located at the intersection of the selected row of sectors and the selected one or two adjacent columns of sectors.

In another embodiment, the semiconductor memory also includes a plurality of vertical local row decoders coupled to the plurality of horizontal local row decoders to select a row of memory cells in the selected one or two adjacent sectors in response to a third plurality of row address signals.

In accordance with another embodiment of the present invention, a semiconductor memory includes a memory array having a plurality of sectors each having a plurality of rows and columns of memory cells, a horizontal global row decoder, a vertical global row decoder, and a plurality of horizontal local row decoders. The horizontal global row decoder is configured to provide a first plurality of predecoded row address signals on a first plurality of lines extending across the memory array in a direction parallel to the rows of memory cells. The vertical global row decoder is configured to provide a second plurality of predecoded row address signals on a second plurality of lines extending across the memory array in a direction parallel to the columns of memory cells. The plurality of horizontal local row decoders are configured so that one of the plurality of horizontal local row decoders selects one or both of two sectors located adjacent to the one of the plurality of horizontal local row decoders in response to a unique combination of the first and second plurality of predecoded row address signals.

In another embodiment, the semiconductor memory further includes a plurality of vertical local row decoders configured to provide a third plurality of predecoded row address signals on a third plurality of lines extending across the memory array in a direction parallel to the columns of memory cells. The one of the plurality of horizontal local row decoders selecting one or both of two sectors located adjacent to the one of the plurality of horizontal local row decoders further selects a row of memory cells in the selected one or both of two sectors in response to the third plurality of predecoded row address signals.

In another embodiment, the vertical local row decoders are located along at least one side of the memory array, the vertical local row decoders being equal in number to the plurality of columns of horizontal local row decoders.

In another embodiment, each of the plurality of horizontal local row decoders includes a logic gate coupled to a decode circuit. The logic gate is configured to provide an output signal in response to a subset of the first plurality of signals and a subset of the second plurality of signals. The decode circuit is configured to provide a plurality of output signals in response to the output signal of the logic gate and the third plurality of predecoded row address signals.

In another embodiment, of the plurality of rows and columns of sectors, the logic gate in the one of the plurality of horizontal local row decoders operates to select the one or both of two sectors located adjacent to the one of the plurality of horizontal local row decoders in response to a preselected subset of each of the first and second plurality of predecoded row address signals. The decode circuit in the one of the plurality of horizontal local row decoders operates to select one of the rows of memory cells in the selected one or both of two sectors in response to the output signal of the logic gate and the third plurality of predecoded row address signals.

In another embodiment, the plurality of sectors are arranged along rows and columns, and the plurality of horizontal local row decoders are arranged along a plurality of rows and columns. Each column of the horizontal local row decoders separates two columns of sectors.

The following detailed description and the accompanying drawings provide a better understanding of the nature and advantages of the present invention.

DETAILED DESCRIPTION OF THE INVENTION

Figure 1:
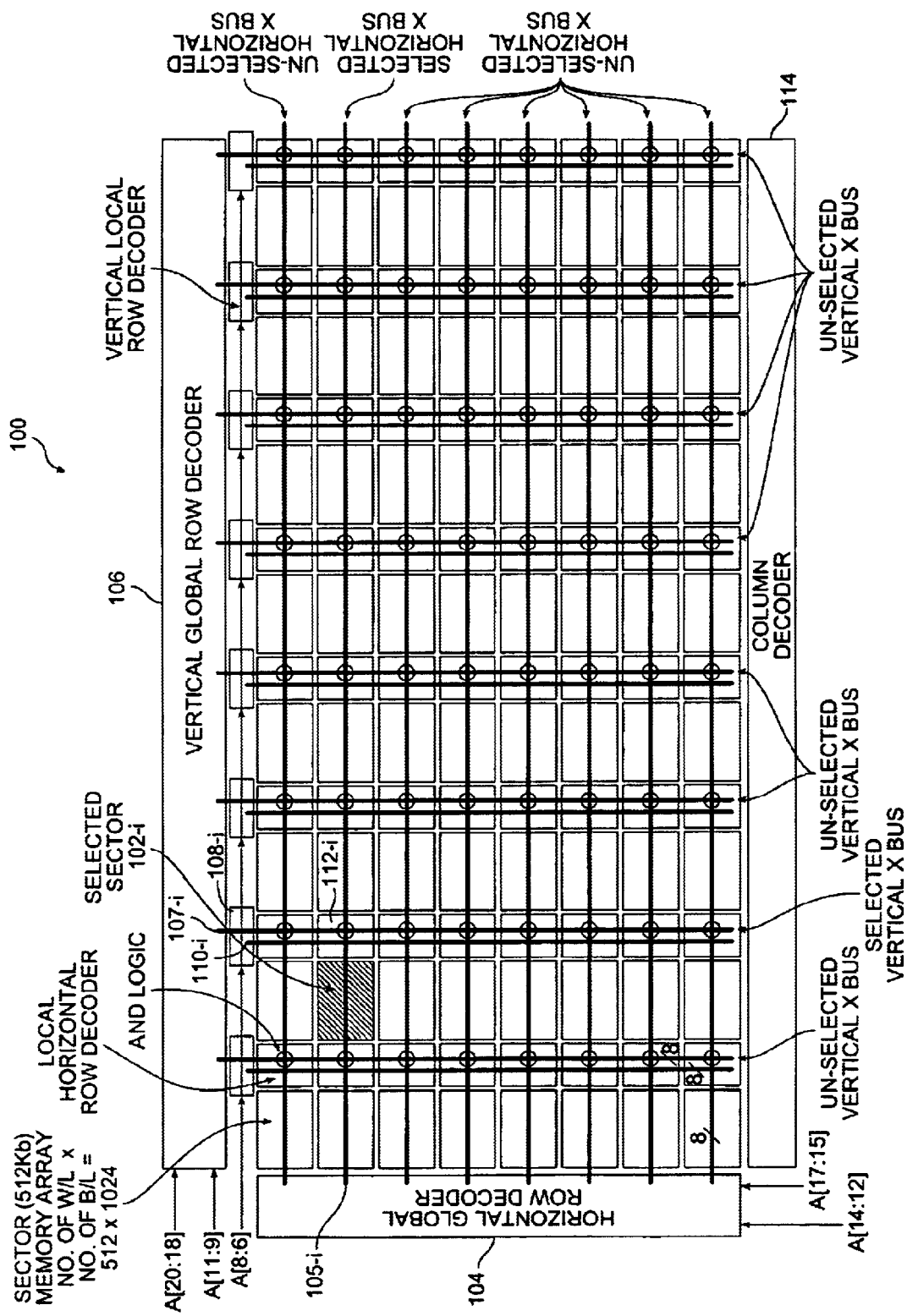
FIG. 1 is a simplified block diagram of a non-volatile semiconductor memory 100 illustrating a memory architecture and row decoding technique in accordance with an embodiment of the present invention.

FIG. 1 is a simplified block diagram of a 32 Mb semiconductor memory 100 illustrating a memory architecture and row decoding technique in accordance with an embodiment of the present invention. The 32 Mb density is only illustrative and not intended to be limiting. The memory architecture and row decoding technique shown in FIG. 1 can be modified by one skilled in this art to implement any density and type of memory in view of the present disclosure.

Memory 100 includes a memory array having 64 memory sectors 102-i of 512 rows by 1024 columns of cells each (64 Kb per sector). The sectors are arranged along eight rows and eight columns. A horizontal global row decoder 104 is shown along the left side of the memory array. This row decoder receives two sets of row addresses A<14:12> and A<17:15>, and provides predecoded row address signals on eight groups of global lines 105-i extending horizontally across the memory array. Each group of global lines 105-i includes eight lines. Addresses A<17:15> are decoded to select one of the eight groups of global lines 105-i, and addresses A<14:12> are decoded to select one of the eight signal lines in the selected group of global lines. Although horizontal global row decoder 104 is shown as directly receiving addresses A<17:12>, these addresses may be predecoded via predecode circuits and then the predecoded signals be provided to horizontal global row decoder 104.

A vertical global row decoder 106 is shown extending along the top of the memory array. This row decoder receives two sets of row addresses A<11:9> and A<20:18> and provides predecoded row address signals on eight groups of global lines 107-i extending vertically across the memory array. Addresses A<20:18> are decoded to select one of the eight groups of global lines 107-i, and addresses A<11:9> are decoded to select one of the eight signal lines in the selected group of global lines. Although vertical global row decoder 106 is shown as directly receiving addresses A<11:9> and A<20:18>, these addresses may be predecoded via predecode circuits and then the predecoded signals are provided to vertical global row decoder 106.

Eight vertical local row decoders 108-i are shown between vertical global row decoder 106 and the array. Each vertical local row decoder 108-i receives row addresses A<8:6>, and decodes these addresses to select one of the eight signal lines 10-i extending vertically across the memory array.

Eight horizontal local row decoders 112-i are shown between every two adjacent columns of sectors. As shown, each of eight groups of signal lines 110-i driven by vertical local row decoders 108-i is paired with a corresponding one of eight groups of lines 107-i driven by vertical global row decoder 106, each pair extending through one of the eight columns of horizontal local row decoders 112-i. Each of the eight groups of signal lines 105-i driven by horizontal global row decoder 104 extends horizontally over a corresponding one of the eight rows of sectors and horizontal local row decoders.

The horizontally-extending groups of signal lines 105-i and the vertically extending groups of signal lines 107-i form a grid. Each horizontal local row decoder 112-i includes a first decode circuit (not shown in FIG. 1) which receives a unique combination of signal lines 105-i and 107-i to select a corresponding sector for a read, write or erase operation. Each horizontal local row decoder 112-i further includes a second decode circuit (not shown in FIG. 1) which receives signal lines 110-i and an output signal of the first decode circuit, and in response selects a row of memory cells in the selected sector.

Although horizontal global row decoder 104 is shown along the left side of the memory array, it may also be placed along the right side of the array. Alternatively, it may be placed along both left and right sides of the array. This may be desirable for high-speed applications where the area penalty due to two horizontal global row decoders is not a concern. In another embodiment, horizontal global row decoder 104 is placed along the center of the memory array, thus dividing array to a right-half array and a left-half array.

Similarly, vertical global row decoder 106 may be located along the bottom side of the array rather than top as shown in FIG. 1. Alternatively, vertical global row decoder 106 may be placed along both top and bottom sides of the array. In another embodiment, vertical global row decoder 106 is placed along the center of the memory array, thus dividing the array to an upper-half array and a lower-half array. These possible variations for the location of vertical global row decoder 106 also apply to vertical local row decoders 108-i.

As can be seen, many combinations of locations are possible for the vertical and horizontal global row decoders and the vertical local row decoders. Depending on the design targets, modifying the configuration of these blocks from that shown in FIG. 1 would be obvious to one skilled in this art in view of this disclosure.

The cross-hatched sector 102-i and a corresponding wordline in sector 102-i are selected as follows. In response to row addresses A<17:12>, horizontal global row decoder 104 selects signal line group 105-i from the eight groups of signal lines, as well as one of the eight signal lines in the selected signal line group 105-i. In response to row addresses A<20:18> and A<11:9>, vertical global row decoder 106 selects signal line group 107-i from the eight groups of signal lines, as well as one of the eight signal lines in the selected signal line group 107-i. The first decode circuit (not shown) in horizontal local row decoder 112-i receives the selected one of the eight signal lines in each of signal line groups 105-i and 107-i, and in response selects one of a number of groups of decoded wordline drivers (not shown) in horizontal local wordline driver 102-i. Each of the groups of the decoded wordline drivers receives the eight predecoded signals 110-i generated by vertical local wordline driver 108-i. In response to row addresses A<8:6>, vertical local wordline decoder 108-i selects one of the eight predecoded signals 110-i. In response to the selected one of predecoded signals 110-i, the decoded wordline drivers in horizontal local driver 112-i select one wordline in sector 102-i.

Column decoder 114 along the bottom of the array selects one or more column(s) from the selected sector 102-i in response to column addresses (not shown) in accordance with conventional methods. Accordingly, the cell(s) located at the intersection of the selected row and column(s) in sector 112-i is accessed for read, program, or erase operations. More than one sector may be selected in a given operation depending on the design goals.

Using a multi-layer metal process, in one embodiment, a first layer metal is used for the vertically-extending bitlines, a second layer metal is used for portions of the eight groups of lines 105-i extending over the horizontal local row decoders 112-i, and a third layer metal is used for each of: (i) the portions of the eight groups of signal lines 105-i extending over the sectors, (ii) the eight groups of signal lines 107-i extending through the columns of horizontal local row decoders 112-i, and (iii) the eight groups of signal lines 110-i generated by the local vertical row decoders 108-i. In another embodiment, the use of the second and third layers metal is reversed.

Figure 2:
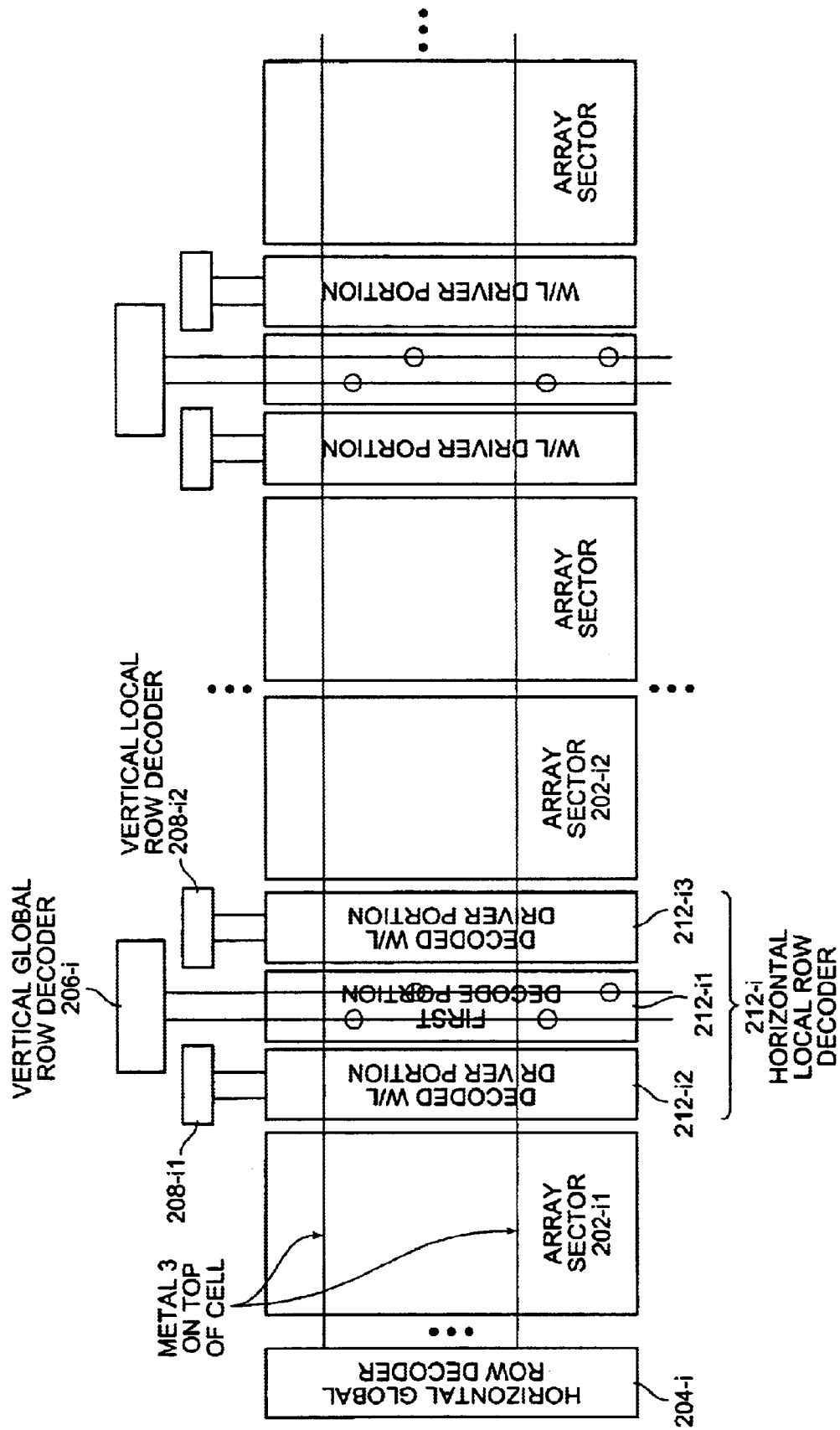
FIG. 2 shows a row of sectors and the corresponding row decode blocks in accordance with another embodiment of the present invention.

FIG. 2 shows one row of sectors and the corresponding row decode blocks in accordance with another embodiment of the present invention. As shown, two columns of horizontal local row decoders 212-i are included for every four adjacent columns of sectors (FIG. 1 shows one column of horizontal local row decoders 112-i for each column of sectors).

Each horizontal local row decoder 212-i includes a first decoder portion 212-i1 and two decoded wordline driver portions 212-i2, and 212-i3. First decoder portion 212-i1 decodes the signal lines from vertical global row decoder 206-i to select one of a group of decoded word-line drivers (not shown) in each of wordline driver portions 212-i2 and 212-i3. The selected group of wordline drivers in each of wordline driver portions 212-i2 and 212-i3 then decodes the signal lines from corresponding vertical local row decoders 208-i1 and 208-i2 to select a wordline from corresponding array sectors 202-i1 and 202-i2.

In one embodiment, decoded wordline driver portion 212-i2 drives the wordlines in sector 202-i1, and decoded wordline driver portion 212-i3 drives wordlines in sector 202-i2. Alternatively, each wordline driver portion 212-i2 and 212-i3 drives wordlines in both sectors 202-i1 and 202-i2, as shown in FIG. 3.

Figure 3:
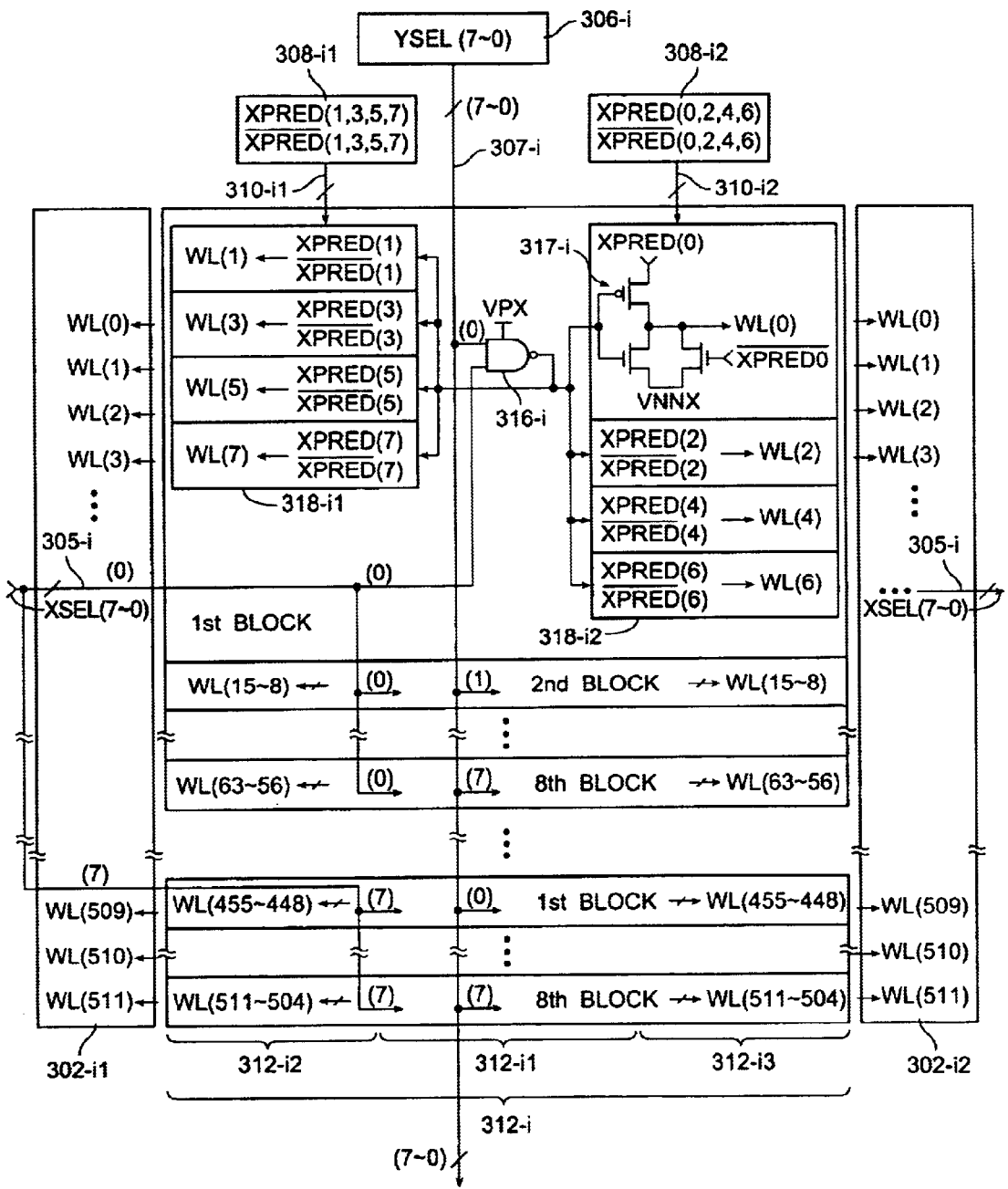
FIG. 3 shows one circuit implementation of the horizontal local row decoder.

FIG. 3 shows one circuit implementation of the horizontal local row decoder 212-i in FIG. 2. One horizontal local row decoder 312-i and its two adjacent sectors 302-i1 and 302-i2 are shown. A first decode portion 312-i1 of each horizontal local row decoder 312-i includes one logic gate 316-i for every four wordlines (each sector 302-i1, 302-i2 has 512 wordlines). These logic gates receive vertically-extending signal lines 307-i generated by vertical global row decoder 306-i and horizontally-extending signal lines 305-i generated by the horizontal global row decoder (not shown). Logic gates 316-i perform decode function on the signals they receive. A two-input NAND gate is shown for logic gate 316-i. A four-transistor CMOS NAND implementation may be used for logic gate 316-i, however, other logic gates and transistor implementations may be used as would be obvious to one skilled in the art.

Each of decoded wordline driver portions 312-i2, 312-i3 includes one decoded wordline driver 317-i per wordline. Wordline driver 317-i drives one wordline (e.g., WL<0>) in each of sectors 302-i1, 302-i2. The wordline drivers are arranged in groups of four, with two groups of four wordline drivers (e.g., groups 318-i1 and 318-i2) having a common input terminal coupled to an output terminal of one logic gate 316-i.

Decoded wordline driver portions 312-i2, 312-i3 receive vertically-extending signal lines 310-i1, 310-i2 generated by vertical local row decoders 308-i1, 308-i2. Signal lines 310-i1, 310-i2 carry true and complement of each signal generated by the corresponding vertical local row decoder 308-i1, 308-i2. Each wordline driver 317-i performs a decode function on the output signal received from the corresponding logic gate 316-i and the set of true and complement signals received from the corresponding vertical local row decoder 308-i1, 308-i2. Wordline driver 317-i is a three-transistor NOR gate, however, other logic gates and transistor implementations may be used as would be obvious to one skilled in the art.

As shown, logic gate 316-i is coupled between supply voltage VPX and ground potential. Supply voltage VPX represents a multiplexed supply line which is biased to the supply voltage VCC (e.g., 1.8V supply or 3V supply) or to a boosted voltage (e.g., to 3V from a 1.8V supply, or to 5V from a 3V supply) during read operation, and to supply voltage VPP (e.g., +9V) during programming operation. VPP is generally greater than VCC, since higher array voltages are required during programming.

Each wordline driver 317-i includes a decoded-supply CMOS inverter along with a decoded NMOS transistor. The decoded-supply CMOS inverter is coupled between one of predecoded signals 310-i1, 310-i2 and supply voltage VNNX. Supply voltage VNNX represents a multiplexed supply line which can be biased to provide the necessary supply voltage during each of read, programming, and erase operations. The input terminal of the CMOS inverter is coupled to an output terminal of a corresponding logic gate 316-i, and the output terminal of the inverter is coupled to a wordline in each of sectors 302-i1 and 302-i2. The decoded NMOS transistor of each wordline driver is coupled between the corresponding wordline and the supply voltage VNNX, and receives at its gate the complement of the same decode signal coupled to the supply terminal of the CMOS inverter.

Supply voltages VPX and VNNX, or variations thereof, are commonly used in EPROMs, EEPROMs, and flash EPROMs/EEPROMs to supply the requisite voltages to the array. However, the row decoding technique, in accordance with the present invention, is not limited to any particular type of memory, and can be modified by one of skilled in this art, in view of this disclosure, to be included in other types of semiconductor memories such as DRAMs and SRAMs.

While the above is a complete description of the embodiments of the present invention, it is possible to use various alternatives, modifications and equivalents. For example, memory 100 (FIG. 1) may be a flash non-volatile memory, and during an erase operation one or more sectors are selected for simultaneous sector erase. Further, the circuit diagrams are for depiction of the various circuit elements and do not necessarily limit the layout or other architectural aspects of the array. Therefore, the scope of the present invention should be determined not with reference to the above description but should, instead, be determined with reference to the appended claim, along with their full scope of equivalents.

What is claimed is:

1. A semiconductor memory comprising:
   a memory array having a plurality of sectors each having a plurality of rows and columns of memory cells;

a horizontal global row decoder configured to provide a first plurality of predecoded row address signals on a first plurality of lines extending across the memory array in a direction parallel to the rows of memory cells;

a vertical global row decoder configured to provide a second plurality of predecoded row address signals on a second plurality of lines extending across the memory array in a direction parallel to the columns of memory cells; and a plurality of horizontal local row decoders being configured so that one of the plurality of horizontal local row decoders selects one or both of two sectors located adjacent to the one of the plurality of horizontal local row decoders in response to a unique combination of the first and second plurality of predecoded row address signals.

2. The semiconductor memory of claim 1 further comprising a plurality of vertical local row decoders configured to provide a third plurality of predecoded row address signals on a third plurality of lines extending across the memory array in a direction parallel to the columns of memory cells, the one of the plurality of horizontal local row decoders selecting a row of memory cells in the selected one or both of two sectors in response to the third plurality of predecoded row address signals.

3. The semiconductor memory of claim 2 wherein the vertical local row decoders are located along at least one side of the memory array, the vertical local row decoders being equal in number to the plurality of columns of horizontal local row decoders.

4. The semiconductor memory of claim 2 wherein each of the plurality of horizontal local row decoders comprises:

a logic gate configured to provide an output signal in response to a subset of the first plurality of signals and a subset of the second plurality of signals; and a decode circuit configured to provide a plurality of output signals in response to the output signal of the logic gate and the third plurality of predecoded row address signals.

5. The semiconductor memory of claim 4 wherein the logic gate is an AND gate.

6. The semiconductor memory of claim 4 wherein:

of the plurality of rows and columns of sectors, the logic gate in the one of the plurality of horizontal local row decoders operates to select the one or both of two sectors located adjacent to the one of the plurality of horizontal local row decoders in response to a preselected subset of each of the first and second plurality of predecoded row address signals, and the decode circuit in the one of the plurality of horizontal local row decoders operates to select one of the rows of memory cells in the selected one or both of two sectors in response to the output signal of the logic gate and the third plurality of predecoded row address signals.

7. The semiconductor memory of claim 1 wherein the plurality of sectors are arranged along rows and columns, and the plurality of horizontal local row decoders are arranged along a plurality of rows and columns, each column of the horizontal local row decoders separating two columns of sectors.

8. The semiconductor memory of claim 7 wherein the second plurality of lines are divided into a plurality of groups of lines equal in number to the plurality of columns of horizontal local row decoders, each group of the second plurality of lines extending through one of the plurality of columns of horizontal local row decoders.

9. The semiconductor memory of claim 8 wherein the plurality of rows of horizontal local row decoders are equal in number to the rows of sectors, the first plurality of lines being divided into a plurality of groups of lines equal in number to the plurality of rows of horizontal local row decoders, each group of the first plurality of lines extending over one of the plurality of rows of sectors.

10. The semiconductor memory of claim 9 wherein the horizontally extending groups of the first plurality of lines and the vertically extending groups of the second plurality of lines form a grid, the semiconductor memory further including a logic gate at every intersection of the grid for selecting a corresponding one or both of two adjacent sectors.

11. The semiconductor memory of claim 7 further comprising a plurality of vertical local row decoders configured to provide a third plurality of predecoded row address signals on a third plurality of lines extending across the memory array in a direction parallel to the columns of memory cells, wherein the third plurality of lines are divided into a plurality of groups of lines equal in number to the plurality of columns of horizontal local row decoders, each group of the third plurality of lines extending through one of the plurality of columns of horizontal local row decoders.

12. The semiconductor memory of claim 7 wherein the horizontal local row decoders along each column of horizontal local row decoders equal in number to the plurality of sectors along a column of sectors, each horizontal local row decoder including a first decode circuit configured to receive a unique combination of the first and second plurality of predecoded row address signals for selecting one or both of two adjacent sectors between which the horizontal local row decoder is located.

13. The semiconductor memory of claim 12 further comprising a plurality of vertical local row decoders configured to provide a third plurality of predecoded row address signals on a third plurality of lines extending across the memory array in a direction parallel to the columns of memory cells, wherein each horizontal local row decoder further includes a second decode circuit configured to receive the third plurality of predecoded row address signals and an output signal from the corresponding first decode circuit for selecting a row of memory cells in the selected one or both of the two adjacent sectors.

14. The semiconductor memory of claim 13 wherein the second decode circuit includes a plurality of decoded wordline drivers each comprising:

an inverter coupled between one of said third plurality of lines and a first supply voltage, an input terminal of the inverter being coupled to an output terminal of the first decode circuit and an output terminal of the inverter being coupled to a wordline in the corresponding sector; and a transistor coupled between the wordline and the first supply voltage, having a gate terminal coupled to another one of said third plurality of lines.

15. The semiconductor memory of claim 14 wherein the first supply voltage is set to a voltage in the range of 1.8V to 5V during read operation, 6V to 10V during program operation, and −6V to −10V during erase operation.

16. The semiconductor memory of claim 13 wherein the first decode circuit includes a logic gate having a first input terminal coupled to one of said first plurality of lines, a second input terminal coupled to one of said second plurality of lines, and an output terminal coupled to an input terminal of the second decode circuit.

17. The semiconductor memory of claim 16 wherein the logic gate performs a AND function.

18. The semiconductor memory of claim 1 wherein the horizontal global row decoder is located along at least one side of the memory array.

19. The semiconductor memory of claim 1 wherein the horizontal global row decoder is located along the center of the memory array separating the memory array into a right-half array and a left-half array.

20. The semiconductor memory of claim 1 wherein the vertical global row decoder is located along at least one side of the memory array.

21. The semiconductor memory of claim 1 wherein the vertical global row decoder is located along the center of the memory array separating the memory array into a top-half array and a bottom-half array.

22. The semiconductor memory of claim 1 wherein the semiconductor memory is a flash non-volatile memory, and during an erase operation one or more sectors are selected for simultaneous sector erase.

23. The semiconductor memory of claim 1 wherein a corresponding column of cells in each sector along each column of sectors form a continuous bitline.

24. A semiconductor memory comprising:
   a memory array having a plurality of rows and columns of sectors each having a plurality of rows and columns of memory cells;
   a horizontal global row decoder configured to provide a first plurality of predecoded row address signals on a first plurality of lines extending across the memory array in a direction parallel to the rows of memory cells;
   a vertical global row decoder configured to provide a second plurality of predecoded row address signals on a second plurality of lines extending across the memory array in a direction parallel to the columns of memory cells;
   a vertical local row decoder configured to provide a third plurality of predecoded row address signals on a third plurality of lines extending across the memory array in a direction parallel to the columns of memory cells; and
   a plurality of horizontal local row decoders each being located between every two sectors along the rows of sectors, each of the plurality of horizontal local row decoders being coupled to the rows of memory cells in its two adjacent sectors, and each of the plurality of horizontal local row decoders being configured to receive a unique combination of the first, second, and third plurality of predecoded row address signals for selecting a row of memory cells in one or both of its two adjacent sectors.

25. The semiconductor memory of claim 24 wherein the plurality of horizontal local row decoders are arranged along rows and columns, each column of the horizontal local row decoders separating two columns of sectors.

26. The semiconductor memory of claim 24 wherein the second plurality of lines are divided into a plurality of groups of lines equal in number to the plurality of columns of horizontal local row decoders, each group of the second plurality of lines extending through one of the columns of horizontal local row decoders.

27. The semiconductor memory of claim 26 wherein the first plurality of lines are divided into a plurality of groups of lines equal in number to the plurality of rows of sectors, each group of the first plurality of lines extending over one of the plurality of rows of sectors.

28. The semiconductor memory of claim 27 wherein the plurality of groups of lines of the first plurality of lines and the plurality of groups of lines of the second plurality of lines form a grid, and a logic gate at every intersection of the grid uniquely decoded to select one or both of two sectors adjacent the logic gate.

29. The semiconductor memory of claim 24 wherein the third plurality of lines are divided into a plurality of groups of lines equal in number to the plurality of columns of horizontal local row decoders, each group of the third plurality of lines extending through one of the plurality of columns of horizontal local row decoders.

30. The semiconductor memory of claim 24 wherein each horizontal local row decoder includes a first decode circuit coupled to receive a unique combination of the first and second plurality of predecoded row address signals for selecting one or both of two adjacent sectors between which the horizontal local row decoder is located.

31. The semiconductor memory of claim 30 wherein each horizontal local row decoder further includes a second decode circuit coupled to receive an output signal of the first decode circuit and the third plurality of predecoded row address signals for selecting a row of memory cells in the selected one or both of the two adjacent sectors.

32. The semiconductor memory of claim 24 wherein the horizontal global row decoder operates to select one of the rows of sectors, the vertical global row decoder operates to select one of the columns of sectors, and the horizontal local row decoder operates to select a sector located at the intersection of the selected one of the rows and columns of sectors.

33. A semiconductor memory comprising:
   a memory array having a plurality of rows and columns of sectors each having a plurality of rows and columns of memory cells;
   a horizontal global row decoder configured to select one of the rows of sectors in response to a first set of row address signals;
   a vertical global row decoder configured to select one or two adjacent columns of the columns of sectors in response to a second set of row address signals; and
   a plurality of horizontal local row decoders coupled to the vertical global row decoder and the horizontal global row decoder to select one or two adjacent sectors located at the intersection of the selected row of sectors and the selected one or two adjacent columns of sectors.

34. The semiconductor memory of claim 33 further comprising a plurality of vertical local row decoders coupled to the plurality of horizontal local row decoders to select a row of memory cells in the selected one or two adjacent sectors in response to a third plurality of row address signals.

35. The semiconductor memory of claim 33 wherein:
   the plurality of horizontal local row decoders are arranged along rows and columns, each column of the horizontal local row decoders separating two columns of sectors,
   the horizontal global row decoder is configured to provide a first plurality of predecoded row address signals on a first plurality of lines extending over and in a direction parallel to the rows of sectors, and
   the vertical global row decoder configured to provide a second plurality of predecoded row address signals on a second plurality of lines extending over and in a direction parallel to the columns of the horizontal local row decoders.

36. The semiconductor memory of claim 35 further comprising a plurality of vertical local row decoders being configured to provide a third plurality of predecoded row address signals on a third plurality of lines extending over and in a direction parallel to the columns of the horizontal local row decoders.

37. The semiconductor memory of claim 36 wherein each of the plurality of horizontal local row decoders is coupled to receive a unique combination of the first, second, and third plurality of predecoded row address signals for selecting a row of memory cells in one or both of its two adjacent sectors.

38. A method of operating a semiconductor memory having a memory array which includes a plurality of rows and columns of sectors each having a plurality of rows and columns of memory cells, the method comprising:

selecting one of the rows of sectors in response to a first plurality of row address signals provided to a horizontal global row decoder;

selecting one or two adjacent columns of the columns of sectors in response to a second plurality of row address signals provided to a vertical global row decoder; and selecting one or both of two adjacent sectors located at the intersection of the selected row of sectors and the selected one or two adjacent columns of sectors in response to a plurality of decode signals provided to a plurality of horizontal local row decoders by the vertical and horizontal global row decoders.

39. The method of claim 38 further comprising selecting a row of memory cells in the selected one or two adjacent sectors in response to a third plurality of row address signals provided to a plurality of vertical local row decoders.

40. The method of claim 38 further comprising:

generating a first plurality of decode signals in response to the first plurality of row address signals;

generating a second plurality of decode signals in response to the second plurality of row address signals;

generating a third plurality of decode signals in response to a third plurality of row address signals; and selecting the one or both of two adjacent sectors in response to a unique combination of the first and second plurality of decode signals; and selecting a row of memory cells in the selected one or two adjacent sectors in response to the third plurality of decode signals.

* * * * *